(12) United States Patent
Arditti Ilitzky et al.

(10) Patent No.: US 10,680,749 B2
(45) Date of Patent: Jun. 9, 2020

(54) EARLY-TERMINATION OF DECODING CONVOLUTIONAL CODES

(71) Applicant: Intel Corporation, Santa Clara, CA (US)

(72) Inventors: David Arditti Ilitzky, Guadalajara (MX); Thomas A. Tetzlaff, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 130 days.

(21) Appl. No.: 15/640,476

(22) Filed: Jul. 1, 2017

(65) Prior Publication Data
US 2019/0007068 A1    Jan. 3, 2019

(51) Int. Cl.
| | | |
|---|---|---|
| *H04L 1/00* | (2006.01) | |
| *H03M 13/29* | (2006.01) | |
| *H03M 13/39* | (2006.01) | |
| *H03M 13/41* | (2006.01) | |
| *H03M 13/37* | (2006.01) | |
| *H03M 13/23* | (2006.01) | |

(52) U.S. Cl.
CPC ...... *H04L 1/0051* (2013.01); *H03M 13/2975* (2013.01); *H03M 13/2993* (2013.01); *H03M 13/3753* (2013.01); *H03M 13/395* (2013.01); *H03M 13/413* (2013.01); *H03M 13/235* (2013.01)

(58) Field of Classification Search
CPC .................. H03M 13/2993; H04L 1/0051
See application file for complete search history.

(56) References Cited

U.S. PATENT DOCUMENTS

| | | | | |
|---|---|---|---|---|
| 4,885,757 A | * | 12/1989 | Provence | G06J 1/005 |
| | | | | 375/343 |
| 5,432,803 A | * | 7/1995 | Liu | H03M 13/3961 |
| | | | | 375/340 |
| 5,563,864 A | * | 10/1996 | Kobayashi | G11B 20/10009 |
| | | | | 369/59.22 |

(Continued)

FOREIGN PATENT DOCUMENTS

WO        02/21784 A1     3/2002

OTHER PUBLICATIONS

A. Taffin, "Generalised stopping criterion for iterative decoders," in Electronics Letters, vol. 39, No. 13, pp. 993-994, Jun. 26, 2003.*

(Continued)

*Primary Examiner* — Steve N Nguyen
(74) *Attorney, Agent, or Firm* — Schiff Hardin LLP

(57) ABSTRACT

A decoder having an input configured to receive a sequence of softbits presumed to correspond to a convolutionally-encoded codeword; and a decoding circuit configured to: determine, as part of a decoding process, a Maximum Likelihood (ML) survivor path in a trellis representation of the codeword; determine whether the presumed convolutionally-encoded codeword meets an early-termination criteria; and abort the decoding process if the presumed convolutionally-encoded codeword meets the early-termination criteria, continue the decoding process if the presumed convolutionally-encoded codeword fails to meet the early-termination criteria.

17 Claims, 5 Drawing Sheets

(56) References Cited

U.S. PATENT DOCUMENTS

| | | | |
|---|---|---|---|
| 6,915,474 B2* | 7/2005 | Taguchi | H03M 13/2975 714/755 |
| 7,983,363 B2* | 7/2011 | Jayaraman | H03M 13/413 375/262 |
| 2004/0230429 A1* | 11/2004 | Son | G10L 19/0212 704/230 |
| 2007/0180351 A1* | 8/2007 | Orio | H03M 13/2975 714/786 |
| 2009/0103659 A1* | 4/2009 | Chen | H03M 13/413 375/341 |
| 2011/0060971 A1* | 3/2011 | Zeng | H03M 13/413 714/786 |
| 2011/0214040 A1* | 9/2011 | Kosakowski | H03M 13/09 714/807 |
| 2012/0144274 A1* | 6/2012 | Gasanov | H03M 13/395 714/792 |
| 2012/0151304 A1* | 6/2012 | Wu | H03M 13/413 714/786 |
| 2012/0210197 A1 | 8/2012 | Jang et al. | |
| 2012/0250736 A1* | 10/2012 | Weisman | H03M 13/413 375/219 |
| 2013/0266097 A1* | 10/2013 | Chen | H03M 13/2975 375/341 |
| 2015/0236723 A1* | 8/2015 | Dowling | H03M 13/2933 714/755 |
| 2016/0036465 A1* | 2/2016 | Kuo | H03M 13/3938 714/792 |

OTHER PUBLICATIONS

Byoung-Sup Shim, Dae-Ho Jeong, Soon-Ja Lim and Hwan-Yong Kim, "A new stopping criterion for turbo codes," 2006 8th International Conference Advanced Communication Technology, Phoenix Park, 2006, pp. 5 pp.-1111.*

L. Shuyang and L. Jianping, "An improved stopping criterion for BICM-ID embedded turbo codes," 2010 IEEE International Conference on Software Engineering and Service Sciences, Beijing, 2010, pp. 129-132.*

Search Report dated Aug. 8, 2018 for Int'l Application No. PCT/US18/32553.

* cited by examiner

Modified Radix-2 ACS Butterfly

Modified ACS

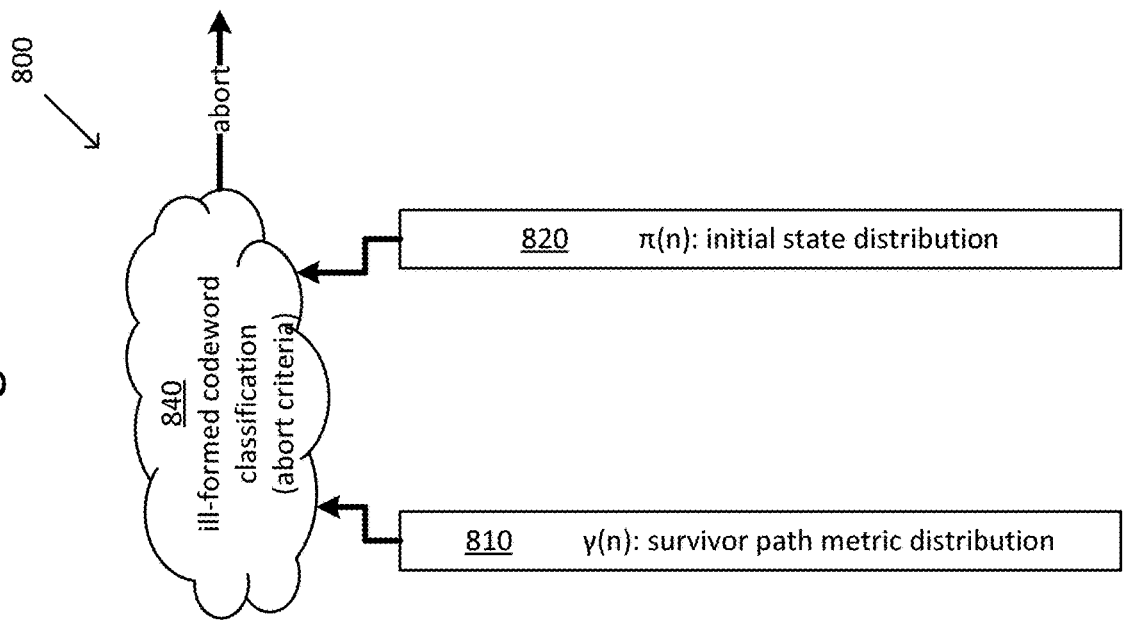
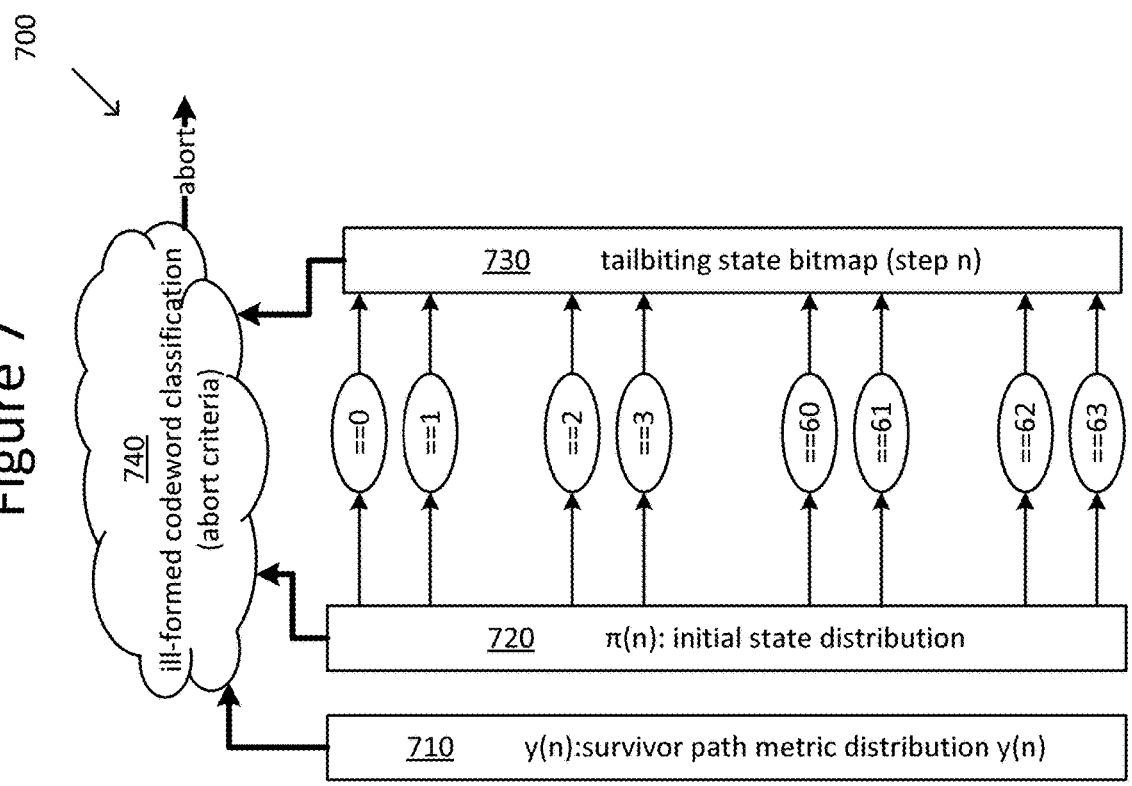

EARLY-TERMINATION OF DECODING CONVOLUTIONAL CODES

BACKGROUND

When decoding convolutionally encoded codewords in a blind manner, a receiver does not know where a codeword starts and/or ends. For this reason, the decoder may try to decode fragments of codewords, concatenations of fragments of distinct codewords, or even concatenations of noise and fragments of codewords. This is referred to as desynchronization of a trellis, and results in decoding problems for both windowed decoding of terminated CC codewords, and iterative decoding of Tail-Biting Convolutionally Coded (TBCC) codewords. Continuing decoding of a desynchronized trellis wastes power and adds processing delay.

Desynchronization of a trellis is relevant to Long Term Evolution (LTE) Physical Downlink Control Channel (PDCCH) blind detection, but also applies to other non-LTE applications of convolutional coding, such as non-LTE cellular/wireless communication, wireline communication, and data storage access. The decoder and decoding method aspects described herein are applicable to any situation where the decoder does not know where the codeword begins and/or ends.

In LTE PDCCH, a User Equipment (UE) receiver attempts TBCC decoding of multiple PDCCH candidates, blindly, until a correctly decoded TBCC codeword directed to the specific UE is found by means of cyclic redundancy check (CRC) match. A PDCCH candidate may be determined by three parameters: codeword size (CS), aggregation level (AL), and location (L) in the control region of the OFDMA subframe. During this blind detection process, a number of different candidates may be attempted to be decoded, at times this results in power-wastage and increased processing latency.

Because in LTE a UE cannot extract useful downlink user traffic until the UE has completed the PDCCH blind detection, a latency increase in the blind detection then incurs in an indirect increase in power and complexity. As PDCCH detection time increases, the number of full Orthogonal Frequency-Division Multiple Access (OFDMA) symbols that need to be fully buffered for potential subsequent processing increases. The Fast Fourier Transform (FFT) processing on OFDM symbols needs to be full, as the UE does not know yet in which subcarriers its allocations lie. When no allocations exist for the UE, the amount of time it takes for the UE to reach a power-saving state will increase. When allocations exist for the UE, the amount of time available for user traffic processing will decrease, thereby requiring more compute power to finish in time. For low-power LTE devices, it is desired to accelerate the PDCCH blind detection procedure.

BRIEF DESCRIPTION OF THE DRAWINGS

FIG. 7 illustrates a Viterbi algorithm forward recursion early-termination structure in a Tail-Biting Convolutional Code 64-state trellis in accordance with aspects of the disclosure.

FIG. 8 illustrates a Viterbi algorithm forward recursion early-termination structure in a Windowed Convolutional Code 64-state trellis in accordance with aspects of the disclosure.

DESCRIPTION OF THE ASPECTS

The present disclosure is directed to a decoder and decoding method for detecting desynchronization of a trellis and terminate decoding of convolutionally-encoded codewords early.

By way of overview, a decoding abort criteria, referred to as "early-termination criteria", is based on assessing a likelihood of a received softbit sequence being a correctly Convolutional Code (CC) encoded codeword. In other words, there is an additional metric that allows the decoder to detect "ill-formed" codewords as soon as possible, and then aborting the decoding process. The early-termination criteria may be a heuristic classification based on a distribution of survivor-path initial states. For example, a metric may be determined based on this distribution, and a threshold set to classify between correctly-formed and ill-formed codewords. Distinct heuristic classifiers can be devised, including parametric classifiers or non-parametric classifiers such as a neural-network, without limitation to a single heuristic.

Figure 1:
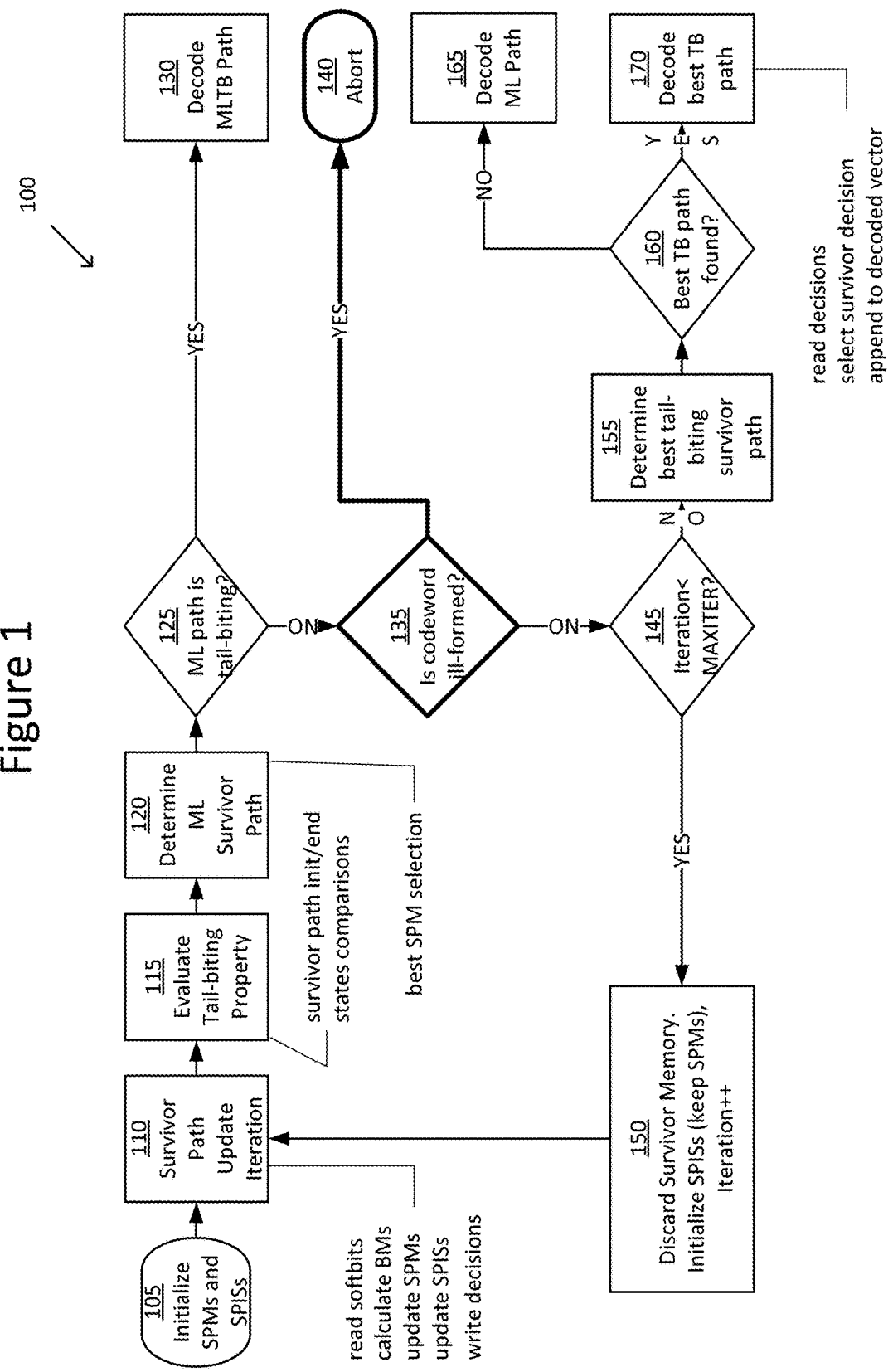
FIG. 1 illustrates a flowchart of a method of early-terminated Tail-Biting Convolutional Code (TBCC) iterative decoding in accordance with aspects of the disclosure.

FIG. 1 illustrates a flowchart 100 of a method of early-terminated Tail-Biting Convolutional Code (TBCC) iterative decoding in accordance with aspects of the disclosure. The decoding method is a Wrap-Around Viterbi Algorithm (WAVA), and LTE PDCCH is used as an example.

A decoder is configured to receive a sequence of softbits assumed to correspond to a codeword generated by a tail-biting convolutional encoder. A decoding circuit in the decoder is configured to process the incoming softbit sequence according to the trellis defined by the convolutional code assumed to have been used to generate the received encoded sequence of bits.

The first Step 105, which is performed only once at the beginning of the decoding process, is to initialize all of the survivor paths, that is, initialize all the Survivor-Path Metrics (SPM) and all the Survivor-Path Initial States (SPIS) in the trellis. For example, in the TBCC case, all SPMs are initialized to zero, and each SPIS is initialized to the survivor path index. Also, in LTE, by way of example, there are 64 survivor paths in the trellis.

In Step 110, there is a survivor path update, which is a forward recursion of the Viterbi algorithm. More specifically, softbits are read, branch metrics (BM) are calculated, SPMs and SPISs are updated, and survivor path decision traces are stored. This process is repeated until all the softbits in the codeword have been consumed, that is, until the complete trellis representation of the codeword has been generated.

In Step 115, the tail-biting property is evaluated for all survivor paths. A survivor path is said to be tail-biting if its initial state and ending state in the trellis are the same.

In Step 120, the Maximum Likelihood (ML) survivor path of the codeword is found. This step is performed by selecting the optimal (either the minimal or maximal, depending on the decoder implementation) survivor path metric.

Then the decoding circuit determines if the ML survivor path is tail-biting (Step 125). If the decoding circuit determines that there is an ML Tail-Biting path (MLTB) (Step 125), the MLTB path is decoded (Step 130). Otherwise, the decoding circuit determines whether the codeword is ill-formed, that is, meets an early-termination criteria (135); this determination is heuristic and discussed in detail below. Decoding is a backwards recursion of the Viterbi algorithm, that is, back-tracing the decision trace of the selected survivor path to decode a codeword in reverse-order.

If the decoding circuit determines that the codeword is ill-formed (i.e., meets an early-termination criteria) (Step 135), the decoding circuit aborts the decoding process (Step 140) in order to avoid wasteful extra survivor path update iterations and Cyclic Redundancy Checks (CRC). If it is not determined with high confidence that the codeword is ill-formed, then another survivor path update iteration will be attempted.

There is generally a limit to on number of survivor path update iterations (e.g., 4, 6, or 8) (Step 145). If the decoder is attempting to decode something that is not a codeword, there will be wasteful iterations, and after the maximum number of survivor path update iterations is reached, a decoded bit sequence is produced which causes a CRC check fail.

If a number of survivor path update iterations is less than the maximum number of allowed iterations, then the decoder is prepared for another survivor path update iteration (Step 150). To prepare the decoder for another iteration all of the previously stored survivor path decision traces are discarded, the Survivor-Path Initial States (SPIS) are initialized, and the Survivor-Path Metrics (SPM) are maintained for the next iteration.

If a number of survivor path update iterations is not less than the maximum number of allowed iterations, that this, there has been too many iterations, the decoder circuit is configured to determine the best tail-biting survivor path (Step 155); this may be accomplished by either a full search between all tail-biting survivor paths, or by performing iterative pre-tracebacks until a best tail-biting survivor path is found. If a tail-biting survivor path is found, the decoding circuit decodes the tail-biting survivor path (Step 170). On the other hand, if no tail-biting survivor path is found, the decoding circuit decodes the non-tail-biting ML survivor path (Step 165).

Figure 2:
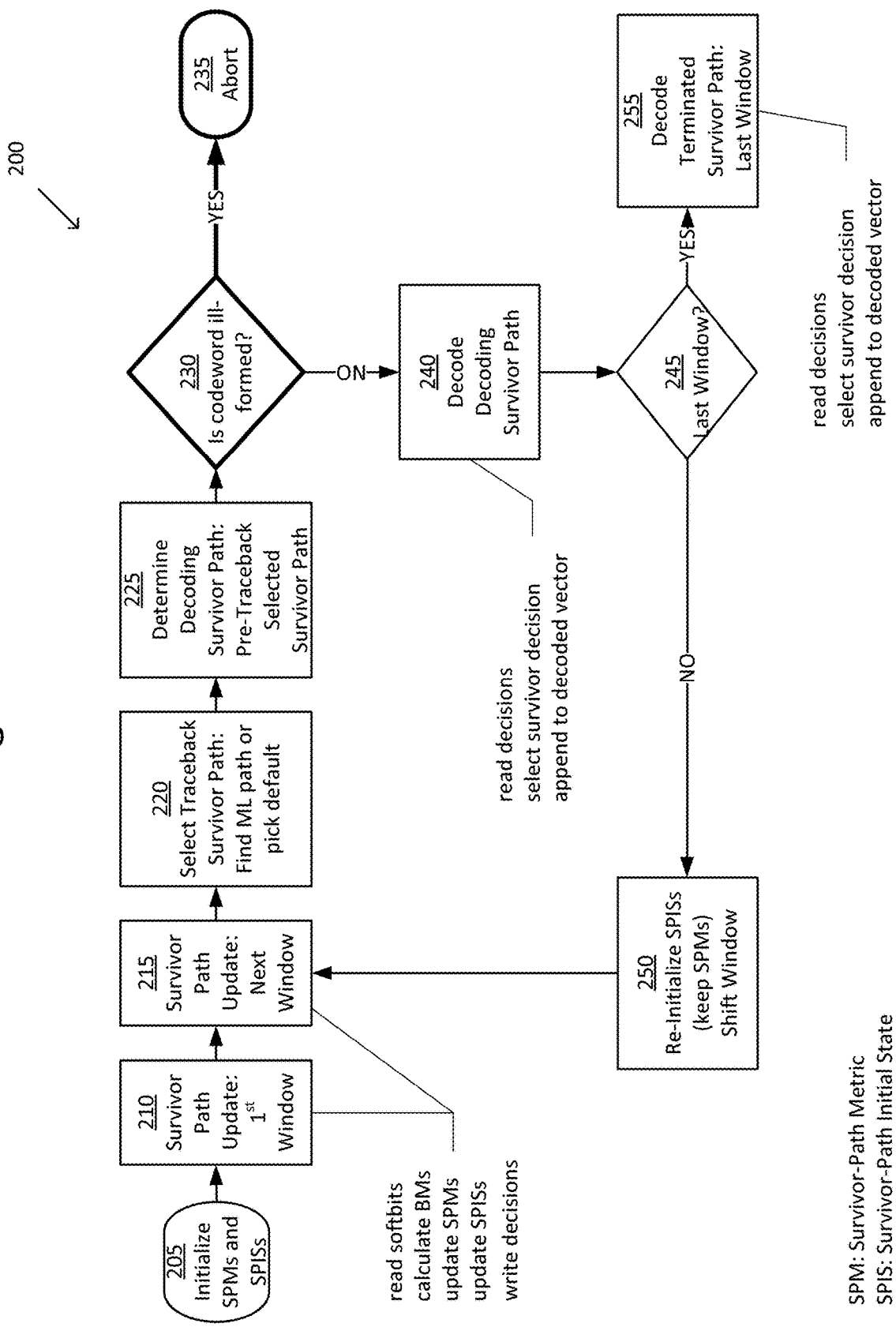
FIG. 2 illustrates a flowchart of a method of early-terminated Convolutional Code (CC) windowed decoding in accordance with aspects of the disclosure.

FIG. 2 illustrates a flowchart 200 of a method of early-terminated Convolutional Code (CC) windowed decoding in accordance with aspects of the disclosure.

When non-tail-biting CC is used, two variables are defined: (1) encoder initial state and (2) encoder final state. The encoder initial state correspond to the encoder shift register value before pushing information bits through it. To force the encoder to end in a particular final state, after shifting all of the information bits through the encoder shift register, the bits corresponding to the desired final state are shifted into the encoder shift register. For example, if the desired encoder final state is 01 (with 0 being the most significant bit), after shifting in all the information bits into the encoder shift register, then the bit 0 followed by the bit 1 are shifted into the encoder shift register, so that the encoder ends in state 01.

When decoding non-tail-biting CC codewords of large sizes or even continuously encoded streams, the optimal decoding of the codeword (i.e., the Viterbi algorithm) may lead to very large decoding latencies. In these cases it is common to segment the complete codeword in non-overlapping windows and perform a windowed decoding, thus allowing the decoding latency to be reduced while keeping a sufficient decoding performance.

The decoder has an input configured to receive sequence of softbits assumed to correspond to a codeword generated by a non-tail-biting convolutional encoder. In first Step 205, which is performed only at the beginning of the decoding process, the decoding circuit is configured to initialize SPMs and SPISs. For example, in the non-TBCC case, SPMs are initialized non-uniformly to create a bias for the SPM corresponding to the known initial state, and each SPIS is initialized to the survivor path index.

In Step 210 the decoding circuit performs the survivor path update, which is a forward recursion of the Viterbi algorithm, for the first window of the codeword. For the survivor path update, the decoding algorithm reads softbits, calculates BMs, updates SPMs and SPICs, and stores survivor path decisions traces.

At Step 215, if the decoding process is in a window (iteration) other than the last window (iteration), the decoding circuit updates the survivor paths for the next window (iteration), that is, the SPMs and SPISs are updated by processing the soft-bits corresponding to the next window.

The decoding circuit is then configured to select a survivor path that will be used to traceback on the next window (Step 220), called the traceback survivor path. The traceback survivor path may correspond to the determined ML survivor path, or it may correspond to a default (user configured) survivor path.

The decoding circuit determines the decoding survivor path in Step 225. The decoding survivor path corresponds to the next window initial state. In other words, pre-traceback is performed to the selected traceback survivor path. Each window, except for the first, is traced-back to its beginning to find the decoding survivor path to decode in the previous window. The pre-traceback can be performed immediately, without incurring latency, by selecting the SPIS corresponding to the selected traceback survivor path.

For each decoding window, the decoding circuit is configured to determine whether the decoding process should be early-terminated due to the codeword thus far being ill-formed (Step 230). If the early-termination criteria determination passes, that is, the codeword seems to be ill-formed, the decoding circuit aborts the decoding process to avoid wasteful decoding iterations and CRC checks (Step 235). On the other hand, if the early-termination criteria determination fails, the decoding circuit decodes the survivor path (Step 240). Only if the decoding process is not early-terminated in Steps 230 and 235 will the window be decoded in Step 240. Each window, except for the last window in the codeword, is decoded from its corresponding decoding survivor path at Step 240.

In Step 245, the decoding circuit is configured to determine whether the decoding window is a last decoding window. If so, the decoding circuit is configured to decode the traceback survivor path of the last window in Step 255. The last window for terminated trellises is decoded from its termination state at Step 255. Otherwise, the decoding circuit reinitializes the SPISs, maintains the SPMs, and shifts the decoding window for the next iteration. Optionally, the early-termination metric may carry forward the metric across windows (and heuristically combine them) to provide more information (and achieve higher accuracy) for early-termination decisions.

Figure 3:
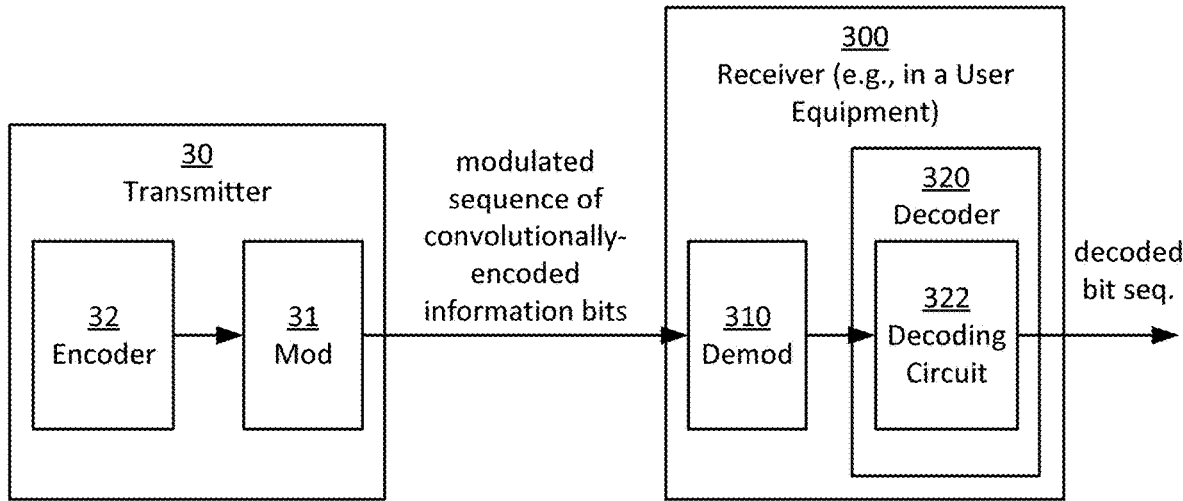
FIG. 3 illustrates a schematic diagram of a receiver comprising a decoder in accordance with aspects of the disclosure.

FIG. 3 illustrates a schematic diagram of a receiver 300 comprising a decoder in accordance with aspects of the disclosure.

To place the receiver 300 in context, FIG. 3 also illustrates a transmitter that comprises an encoder 32 and a modulator 31, which outputs the modulated sequence of convolutionally-enceded information bits.

The receiver 300 comprises a demodulator 310 and a decoder 320 having a decoding circuit 322. The receiver may be that of a User Equipment (UE), but the disclosure is not limited in this respect. The decoder 320 has other application, such as any cellular/wireless communication, wireline communication, and storage access involving desynchronization of a trellis.

The demodulator 310 is configured to receive the modulated sequence of convolutionally-encoded information bits, and convert continuous time signals from a complex field domain into softbits. For example, on a single carrier with binary modulation, which carries a complex number, the demodulator 310 converts the complex number into a real number in the range [−1, 1], called a softbit, whose sign indicates the carried bit (e.g. negative corresponds to a bit 1, while positive corresponds to a bit 0), while its magnitude indicates the likelihood of such decision. The decoding circuit 322 instead of detecting one bit at a time, considers a sequence of softbits in the codeword and makes a ML sequence decoding. The decoding circuit then outputs a decoded sequence of bits.

Figure 4:
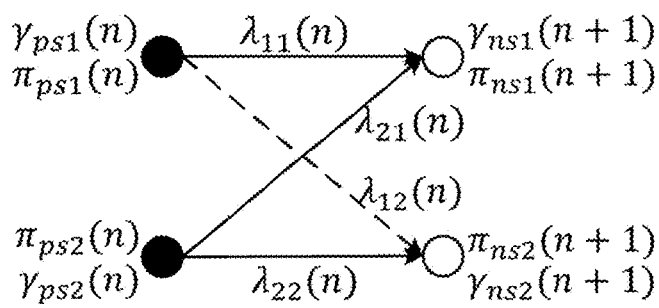
FIG. 4 illustrates a modified radix-2 Add-Compare-Select (ACS) butterfly to enable early-termination in accordance with aspects of the disclosure.
Figure 5:
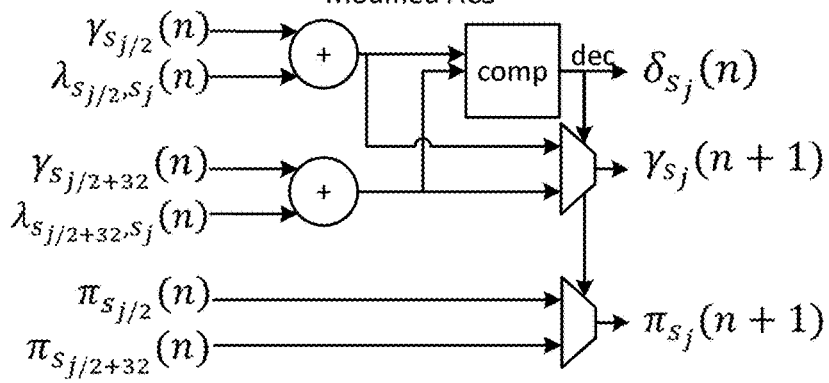
FIG. 5 illustrates a modified radix-2 ACS circuit in accordance with aspects of the disclosure.
Figure 6:
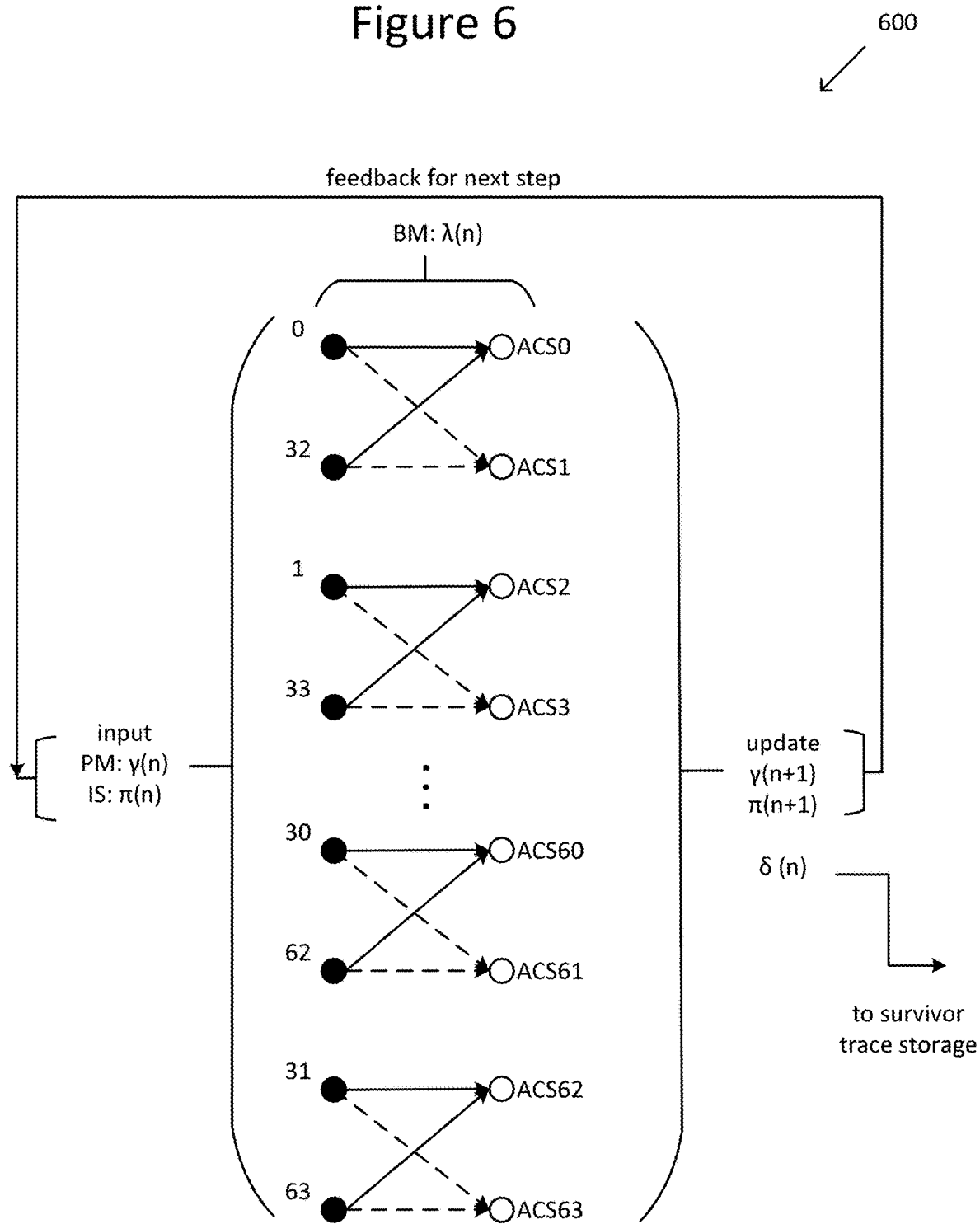
FIG. 6 illustrates a set of parallel modified radix-2 ACS butterflies for a 64-state trellis in accordance with aspects of the disclosure.

FIGS. 4 and 5 illustrate a modified radix-2 Add-Compare-Select (ACS) butterfly 400 to enable early-termination in accordance with aspects of the disclosure. FIG. 6 illustrates a set of parallel modified radix-2 ACS butterflies for a 64-state trellis 600 in accordance with aspects of the disclosure.

An ACS is located with a path metric circuit of a decoder, and is configured to determine path metrics. The radix-2 ACS butterfly has a rate if 1/n for any n, but can be generalized to radix-$2^m$. This modified butterfly also keeps track of the survivor path initial states. $\lambda_{ij}$ represents a branch metric from i-th input-state to j-th output-state. $\gamma_i$ represents the SPM for the i-th survivor path. $\pi_i$ represents the SPIS for the i-th survivor path. The subscript ps # represents a previous state #, and ns # represents a next state #, where #∈{1, 2} represent two possible input-states, or two possible output-states for radix-2. $\delta_i$, represents the survivor path decision, that is, survivor path information to store in the survivor memory. Here the same decision is used to select the SPM and to carry forward the SPIS.

By way of background in Viterbi decoding, the decoding algorithm uses two metrics: the branch metric and the path metric. The branch metric is a measure of the "distance" between what was transmitted and what was received, and is defined for each branch in the trellis. In hard decision decoding, where there is a sequence of digitized parity bits, the branch metric is the Hamming distance between the expected parity bits and the received ones.

The path metric is a value associated with a state (node) in the trellis. For hard decision decoding, it corresponds to the Hamming distance over the most likely path from the initial state to the current state in the trellis. By "most likely", it is meant the path with smallest Hamming distance between the initial state and the current state, measured over all possible paths between the two states. The path with the smallest Hamming distance minimizes the total number of bit errors, and is most likely when the BER is low. The Viterbi algorithm computes the path metric for a (state, time) pair incrementally using the path metrics of previously computed states and the branch metrics. In the decoding algorithm, it is important to remember which path corresponded to the minimum, so the decoder circuit can traverse this path from the final state to the initial one keeping track of the branches used, and then finally reverse the order of the bits to produce the most likely message.

FIG. 7 illustrates a Viterbi algorithm forward recursion early-termination structure 700 in a Tail-Biting Convolutional Code (TBCC) 64-state trellis in accordance with aspects of the disclosure. FIG. 8 illustrates a Viterbi algorithm forward recursion early-termination structure 800 in a Windowed Convolutional Code 64-state trellis in accordance with aspects of the disclosure.

At each trellis step, all the SPISs are readily available to form the initial state distribution 720, 820. Having the initial state distribution available enables quick evaluation of the tailbiting condition on each path (for TBCC decoding of FIG. 7), or immediate evaluation of a survivor path traceback (for windowed CC decoding of FIG. 8), i.e. a pre-traceback.

The SPIS distribution 720, 820, the tailbiting flag for each survivor path 710, 810, and potentially other information, such as which path is the ML path or the MLTB path, are used to determine whether a codeword is ill-formed (Steps 135 and 230 in FIGS. 1 and 2 above). This determination is a heuristic classification to determine whether the decoding process will be early-terminated. This heuristic could be, for example, a data-trained classifier (like an artificial neural network), or a threshold based parametric algorithm.

One example generic threshold-based heuristic involves a survivor path initial state distribution spread. First, find a set of unique (distinct) Survivor Path Initial States (SPIS) available in the distribution; this is referred to as unique-SPIS-set. Second, measure the unique-SPIS-set cardinality. And finally, decide based on a threshold on the unique-SPIS-set cardinality if the codeword is ill-formed or not.

A second example threshold-based heuristic applicable only to iterative TBCC decoding involves the best Tailbiting Survivor Path Initial State. First, find the iteration's best TB path, and obtain its corresponding Survivor Path Initial State (SPIS); this is referred to as the Best Tail-biting Initial State (BTPIS). Second, determine the number of survivor paths having the BTPIS as their initial state; this is referred to as BTPIS-set. Third, measure the BTPIS-set cardinality. Finally, determine based on a threshold on the BTPIS-set cardinality whether the codeword is ill-formed or not.

Alternatively, the heuristic may be based on a trained model, such as a neural network. The clouds 740, 840 in FIGS. 7 and 8 could be neural networks. A neural network is a model that models a way to translate inputs to outputs. The model is trained by providing it with a large amount of data offline before finalizing the design. In this case, the inputs are the survivor path metric distribution 710, 810, the initial state distribution 720, 820, and the tail-biting state 730 (in the case of TBCC); the output in that the codeword is ill-formed (abort) or correctly-formed (iterate again).

The decoder and decoding method described herein has numerous implementation options. These implementations include, but are not limited to, a specific-function digital Intellectual Property (IP) block of an Application Specific Integrated Circuit (ASIC), as instruction extensions for an Application Specific Instruction Processor (ASIP), as decoupled accelerator extensions for a Micro Controller Unit (MCU), and as a software implementation in a General Purpose Processor (GPP).

The decoder and decoding method described herein are an improvement over prior solutions. In the case of LTE PDDCH blind detection, in highly congested networks where the OFDMA control region is tightly packed with as many PDCCHs as possible, previous correlation-based methods do not provide a large number of discarded candidates, thus they only contribute to increasing power consumption and processing latency. The aspects of this disclosure achieve a high rate of early-terminations, with high accuracy, under distinct scenarios with near-sensitivity Signal-to-Noise Ratio (SNR) and high SNR. For the purposes of this discussion, the term circuit shall be understood to be circuit(s), processor(s), logic, software, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function (s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein. In one or more of the exemplary aspects described herein, a circuit can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The following examples pertain to further embodiments.

Example 1 is a decoder, comprising: an input configured to receive a sequence of softbits presumed to correspond to a convolutionally-encoded codeword; and a decoding circuit configured to: determine, as part of a decoding process, a Maximum Likelihood (ML) survivor path in a trellis representation of the codeword; determine whether the presumed convolutionally-encoded codeword meets an early-termination criteria; abort the decoding process if the presumed convolutionally-encoded codeword meets the early-termination criteria; and continue the decoding process if the presumed convolutionally-encoded codeword fails to meet the early-termination criteria.

In Example 2, the subject matter of Example 1, wherein the early-termination criteria is based on a trained model.

In Example 3, the subject matter of Example 1, wherein the determination of whether the presumed convolutionally-encoded codeword meets the early-termination criteria comprises: counting a number of distinct survivor path initial states; and comparing the count with a predetermined threshold.

In Example 4, the subject matter of Example 1, wherein the determination of whether the presumed convolutionally-encoded codeword meets the early-termination criteria comprises: counting a number of paths having a same initial state as the ML survivor path; and comparing the count with a predetermined threshold.

In Example 5, the subject matter of Example 1, wherein the decoding circuit is further configured to: determine whether the ML survivor path is a ML Tail-Biting Path (MLTBP); and if the ML survivor path is not a MLTBP, determine whether the presumed convolutionally-encoded codeword meets the early-termination criteria.

In Example 6, the subject matter of Example 5, wherein if the ML survivor path is a MLTBP, the decoding circuit is configured to decode the MLTBP without determining whether the presumed convolutionally-encoded codeword meets the early-termination criteria.

In Example 7, the subject matter of Example 1, wherein if a number of decoding iterations of the decoding process is less than a maximum number of decoding iterations, the decoding circuit is configured to initialize survivor path initial states.

In Example 8, the subject matter of Example 1, wherein if a number of decoding iterations of the decoding process is greater than or equal to a maximum number of decoding iterations, the decoding circuit is configured to: determine whether a best tail-biting survivor path is found; if a best tail-biting survivor path is found, decode the best tail-biting survivor path; and if a best tail-biting survivor path is not found, decode the ML survivor path.

Example 9 is a receiver comprising the decoder of Example 1.

Example 10 is a user equipment comprising the receiver of Example 9.

Example 11 is a decoder, comprising: an input configured to receive a sequence of softbits presumed to correspond to a convolutionally-encoded codeword; and a decoding circuit configured to: determine, as part of a decoding process, a survivor path of a decoding window in a trellis representation of the codeword; determine whether the presumed convolutionally-encoded codeword meets an early-termination criteria; abort the decoding process if the presumed convolutionally-encoded codeword meets the early-termination criteria; and continue the decoding process if the presumed convolutionally-encoded codeword fails to meet the early-termination criteria.

In Example 12, the subject matter of Example 11, wherein the early-termination criteria is based on a trained model.

In Example 13, the subject matter of Example 11, wherein the determination of whether the presumed convolutionally-encoded codeword meets the early-termination criteria comprises: counting a number of distinct survivor path initial states; and comparing the count with a predetermined threshold.

In Example 14, the subject matter of Example 11, wherein if the presumed convolutionally-encoded codeword fails to meet the early-termination criteria, the decoding circuit is configured to: decode a previous decoding window based on a traceback survivor path of the decoding window.

In Example 15, the subject matter of Example 14, wherein the decoding circuit is configured to: determine whether the decoding window is a last decoding window; and if the decoding window is the last decoding window, decode the traceback survivor path of the decoding window.

In Example 16, the subject matter of Example 14, wherein the decoding circuit is configured to: determine whether the decoding window is a last decoding window; and if the decoding window is not the last decoding window, shift the decoding window and perform another decoding iteration.

Example 17 is a decoding method, comprising: receiving, at an input of a decoder, a sequence of softbits presumed to correspond to a convolutionally-encoded codeword; determining, by the decoder, a Maximum Likelihood (ML)

survivor path in a trellis representation of the codeword; determining, by the decoder, whether the presumed convolutionally-encoded codeword meets an early-termination criteria; aborting the decoding process if the presumed convolutionally-encoded codeword meets the early-termination criteria; and continue the decoding method if the presumed convolutionally-encoded codeword fails to meet the early-termination criteria.

In Example 18, the subject matter of Example 17, wherein the early-termination criteria is based on a trained model.

In Example 19, the subject matter of Example 17, wherein the determining whether the presumed convolutionally-encoded codeword meets the early-termination criteria comprises: counting a number of distinct survivor path initial states; and comparing the count with a predetermined threshold.

In Example 20, the subject matter of Example 17, wherein the determining whether the presumed convolutionally-encoded codeword meets the early-termination criteria comprises: counting a number of paths having a same initial state as the ML survivor path; and comparing the count with a predetermined threshold.

In Example 21, the subject matter of Example 17, further comprising: determining whether the ML survivor path is a ML Tail-Biting Path (MLTBP); and if the ML survivor path is not a MLTBP, performing the determining whether the presumed convolutionally-encoded codeword meets the early-termination criteria.

Example 22 is a system, comprising: a transmitter configured to output a sequence of bits representing a convolutionally-encoded codeword; and a decoder comprising a decoding circuit configured to: receive a sequence of softbits presumed to correspond to the convolutionally-encoded codeword; determine, as part of a decoding process, a survivor path of a decoding window in a trellis representation of the codeword; determine whether the presumed convolutionally-encoded codeword meets an early-termination criteria; abort the decoding process if the presumed convolutionally-encoded codeword meets the early-termination criteria; and continue the decoding process if the presumed convolutionally-encoded codeword fails to meet the early-termination criteria.

In Example 23, the subject matter of Example 22, wherein the early-termination criteria is based on a trained model.

In Example 24, the subject matter of Example 22, wherein the determining whether the presumed convolutionally-encoded codeword meets the early-termination criteria comprises: counting a number of distinct survivor path initial states; and comparing the count with a predetermined threshold.

Example 25 is a decoder, comprising: an input configured to receive a sequence of softbits presumed to correspond to a convolutionally-encoded codeword; and a decoding means for: determining, as part of a decoding process, a Maximum Likelihood (ML) survivor path in a trellis representation of the codeword; determining whether the presumed convolutionally-encoded codeword meets an early-termination criteria; aborting the decoding process if the presumed convolutionally-encoded codeword meets the early-termination criteria; and continuing the decoding process if the presumed convolutionally-encoded codeword fails to meet the early-termination criteria.

In Example 26, the subject matter of Example 25, wherein the early-termination criteria is based on a trained model.

In Example 27, the subject matter of Example 25, wherein the determination of whether the presumed convolutionally-encoded codeword meets the early-termination criteria comprises: counting a number of distinct survivor path initial states; and comparing the count with a predetermined threshold.

In Example 28, the subject matter of Example 25, wherein the determination of whether the presumed convolutionally-encoded codeword meets the early-termination criteria comprises: counting a number of paths having a same initial state as the ML survivor path; and comparing the count with a predetermined threshold.

In Example 29, the subject matter in any of Examples 25-28, wherein the decoding means is further for: determining whether the ML survivor path is a ML Tail-Biting Path (MLTBP); and if the ML survivor path is not a MLTBP, determining of whether the presumed convolutionally-encoded codeword meets the early-termination criteria.

In Example 30, the subject matter of Example 29, wherein if the ML survivor path is a MLTBP, the decoding means is for decoding the MLTBP without determining of whether the presumed convolutionally-encoded codeword meets the early-termination criteria.

In Example 31, the subject matter of Example 25, wherein if a number of decoding iterations of the decoding process is less than a maximum number of decoding iterations, the decoding means is for initializing survivor path initial states.

In Example 32, the subject matter of Example 25, wherein if a number of decoding iterations of the decoding process is greater than or equal to a maximum number of decoding iterations, the decoding means is for: determining whether a best tail-biting survivor path is found; if a best tail-biting survivor path is found, decoding the best tail-biting survivor path; and if a best tail-biting survivor path is not found, decoding the ML survivor path.

Example 33 is a decoder, comprising: an input configured to receive a sequence of softbits presumed to correspond to a convolutionally-encoded codeword; and a decoding means for: determining, as part of a decoding process, a survivor path of a decoding window in a trellis representation of the codeword; determining whether the presumed convolutionally-encoded codeword meets an early-termination criteria; aborting the decoding process if the presumed convolutionally-encoded codeword meets the early-termination criteria; and continuing the decoding process if the presumed convolutionally-encoded codeword fails to meet the early-termination criteria.

In Example 34, the subject matter of Example 33, wherein the early-termination criteria is based on a trained model.

In Example 35, the subject matter of Example 33, wherein the determination of whether the presumed convolutionally-encoded codeword meets the early-termination criteria comprises: counting a number of distinct survivor path initial states; and comparing the count with a predetermined threshold.

In Example 36, the subject matter of Example 33, wherein if the presumed convolutionally-encoded codeword fails to meet the early-termination criteria, the decoding means is for: decoding a previous decoding window based on a traceback survivor path of the decoding window.

In Example 37, the subject matter of Example 36, wherein the decoding means is for: determining whether the decoding window is a last decoding window; and if the decoding window is the last decoding window, decoding the traceback survivor path of the decoding window.

In Example 38, the subject matter of Example 36, wherein the decoding circuit is configured to: determining whether the decoding window is a last decoding window; and if the decoding window is not the last decoding window, shifting the decoding window and perform another decoding iteration.

While the foregoing has been described in conjunction with exemplary aspect, it is understood that the term "exemplary" is merely meant as an example, rather than the best or optimal. Accordingly, the disclosure is intended to cover alternatives, modifications and equivalents, which may be included within the scope of the disclosure.

Although specific aspects have been illustrated and described herein, it will be appreciated by those of ordinary skill in the art that a variety of alternate and/or equivalent implementations may be substituted for the specific aspects shown and described without departing from the scope of the present application. This application is intended to cover any adaptations or variations of the specific aspects discussed herein.

The invention claimed is:

1. A decoder, comprising:
    an input configured to receive a sequence of softbits presumed to correspond to a convolutionally-encoded codeword; and
    a decoding circuit configured to execute, for the received sequence of softbits, a Viterbi-based algorithm to:
        determine, as part of a decoding process, a Maximum Likelihood (ML) survivor path in a trellis representation of the codeword;
        determine whether the presumed convolutionally-encoded codeword meets an early-termination criteria;
        abort execution of the Viterbi-based algorithm for the received sequence of softbits to stop the decoding process if the presumed convolutionally-encoded codeword meets the early-termination criteria irrespective of a number of survivor path update iterations that have already been performed such that the received sequence of softbits are not further processed as part of a decoder operation and the ML survivor path is not decoded; and
        continue the decoding process if the presumed convolutionally-encoded codeword fails to meet the early-termination criteria,
    wherein the early-termination criteria indicates that the codeword is ill-formed based upon an assessed likelihood of the received sequence of softbits being a correctly encoded codeword,
    wherein the early-termination criteria includes a heuristic classification based on a distribution of survivor-path initial states, and
    wherein the decoding circuit is configured to determine a metric based upon the distribution of survivor-path initial states, and to determine whether the codeword is ill-formed based upon comparison of the metric to a threshold, thereby classifying between correctly-formed and ill-formed codewords.

2. The decoder of claim 1, wherein the determination of whether the presumed convolutionally-encoded codeword meets the early-termination criteria comprises:
    counting a number of distinct survivor path initial states; and
    comparing the count with a predetermined threshold.

3. The decoder of claim 1, wherein the determination of whether the presumed convolutionally-encoded codeword meets the early-termination criteria comprises:
    counting a number of paths having a same initial state as the ML survivor path; and
    comparing the count with a predetermined threshold.

4. The decoder of claim 1, wherein the decoding circuit is further configured to:
    determine whether the ML survivor path is a ML Tail-Biting Path (MLTBP); and
    if the ML survivor path is not a MLTBP, determine whether the presumed convolutionally-encoded codeword meets the early-termination criteria.

5. The decoder of claim 4, wherein if the ML survivor path is a MLTBP, the decoding circuit is configured to decode the MLTBP without determining whether the presumed convolutionally-encoded codeword meets the early-termination criteria.

6. The decoder of claim 1, wherein if a number of decoding iterations of the decoding process is less than a maximum number of decoding iterations, the decoding circuit is configured to initialize survivor path initial states.

7. The decoder of claim 1, wherein if a number of decoding iterations of the decoding process is greater than or equal to a maximum number of decoding iterations, the decoding circuit is configured to:
    determine whether a best tail-biting survivor path is found;
    if a best tail-biting survivor path is found, decode the best tail-biting survivor path; and
    if a best tail-biting survivor path is not found, decode the ML survivor path.

8. A receiver comprising the decoder of claim 1.

9. A user equipment comprising the receiver of claim 8.

10. The decoder of claim 1, wherein the decoding circuit is configured to abort execution of the Viterbi-based algorithm for the received sequence of softbits to stop the decoding process by performing no additional survivor path update iterations.

11. The decoder of claim 1, wherein the threshold classifying between correctly-formed and ill-formed codewords includes a parametric classifier.

12. The decoder of claim 1, wherein the decoding circuit is configured to execute, as the Viterbi-based algorithm, a Wrap-Around Viterbi Algorithm (WAVA).

13. The decoder of claim 1, wherein the decoding circuit is configured, upon aborting execution of the Viterbi-based algorithm, to prevent an occurrence of additional survivor path update iterations and cyclic redundancy checks (CRC).

14. A decoding method, comprising:
    receiving, at an input of a decoder, a sequence of softbits presumed to correspond to a convolutionally-encoded codeword;
    executing, by the decoder for the received sequence of softbits, a Viterbi-based algorithm for:
        determining a Maximum Likelihood (ML) survivor path in a trellis representation of the codeword;
        determining whether the presumed convolutionally-encoded codeword meets an early-termination criteria;
        aborting execution of the Viterbi-based algorithm for the received sequence of softbits to stop the decoding process if the presumed convolutionally-encoded codeword meets the early-termination criteria irrespective of a number of survivor path update iterations that have already been performed such that the received sequence of softbits are not further processed as part of a decoder operation and the ML survivor path is not decoded; and
        continuing the decoding method if the presumed convolutionally-encoded codeword fails to meet the early-termination criteria, wherein the early-termination criteria indicates that the codeword is ill-formed based upon an assessed likelihood of the received sequence of softbits being a correctly encoded codeword, wherein the early-termination criteria includes a heuristic classification based on a distribution of survivor-path initial states, and wherein the act of determining whether the presumed convolutionally-encoded codeword meets the early-termination criteria includes determining a metric based upon the distribution of survivor-path initial states, and determining whether the codeword is ill-formed based upon comparison of the metric to a threshold, thereby classifying between correctly-formed and ill-formed codewords.

15. The decoding method of claim 14, wherein the determining whether the presumed convolutionally-encoded codeword meets the early-termination criteria comprises:

counting a number of distinct survivor path initial states; and comparing the count with a predetermined threshold.

16. The decoding method of claim 14, wherein the determining whether the presumed convolutionally-encoded codeword meets the early-termination criteria comprises:

counting a number of paths having a same initial state as the ML survivor path; and comparing the count with a predetermined threshold.

17. The decoding method of claim 14, further comprising:

determining whether the ML survivor path is a ML Tail-Biting Path (MLTBP); and if the ML survivor path is not a MLTBP, performing the determining whether the presumed convolutionally-encoded codeword meets the early-termination criteria.

* * * * *